United States Patent
Geisberger et al.

(10) Patent No.: US 11,440,042 B2
(45) Date of Patent: Sep. 13, 2022

(54) APPARATUS AND METHOD FOR APPLYING A SEALING AND/OR COATING SUBSTANCE

(71) Applicant: Bayerische Motoren Werke Aktiengesellschaft, Munich (DE)

(72) Inventors: Alexander Geisberger, Reissing (DE); Thorsten Lanzl, Siegenburg (DE); Peter Siemsen, Haar (DE)

(73) Assignee: Bayerische Motoren Werke Aktiengesellschaft, Munich (DE)

(*) Notice: Subject to any disclaimer, the term of this patent is extended or adjusted under 35 U.S.C. 154(b) by 57 days.

(21) Appl. No.: 16/811,292

(22) Filed: Mar. 6, 2020

(65) Prior Publication Data

US 2020/0206766 A1  Jul. 2, 2020

Related U.S. Application Data

(63) Continuation of application No. PCT/EP2018/071457, filed on Aug. 8, 2018.

(30) Foreign Application Priority Data

Sep. 7, 2017 (DE) ..................... 10 2017 215 725.9

(51) Int. Cl.
*B05B 13/04* (2006.01)
*B05C 11/10* (2006.01)
(Continued)

(52) U.S. Cl.
CPC ........ *B05B 13/0457* (2013.01); *B05B 12/122* (2013.01); *B05C 11/1021* (2013.01); *G06F 30/20* (2020.01)

(58) Field of Classification Search
USPC ........ 118/712, 692, 665, 666, 667, 679–682, 118/323, 321
See application file for complete search history.

(56) References Cited

U.S. PATENT DOCUMENTS

| 5,814,375 A | 9/1998 | Hissen |
| 8,875,655 B2* | 11/2014 | Pettersson ........... B05B 12/1472 118/713 |

(Continued)

FOREIGN PATENT DOCUMENTS

| CN | 103317846 A | 9/2013 |
| DE | 10 2004 049 471 A1 | 4/2006 |

(Continued)

OTHER PUBLICATIONS

English-language Chinese Office Action issued in Chinese application No. 201880042478.7 dated Oct. 12, 2020 (Seven (7) pages).

(Continued)

*Primary Examiner* — Yewebdar T Tadesse
(74) *Attorney, Agent, or Firm* — Crowell & Moring LLP

(57) ABSTRACT

An apparatus for applying a sealing and/or a coating substance to a component, in particular a vehicle body component. The apparatus includes kinematics, a spray device, and a sensor. The apparatus is configured to: a) acquire computer-aided design (CAD)-based information on the component; and in real time: b) acquire actual information on the component by the first sensor; c) create a movement profile for the kinematics and an application profile for the spray device on a basis of the CAD-based information and the actual information; and d) execute the movement profile and the application profile on the component.

10 Claims, 1 Drawing Sheet

(51) Int. Cl.
    *G06F 30/20*    (2020.01)
    *B05B 12/12*    (2006.01)

(56) References Cited

U.S. PATENT DOCUMENTS

| | | |
|---|---|---|
| 2006/0233945 A1 | 10/2006 | Calvetto et al. |
| 2010/0047465 A1 | 2/2010 | Ansorge et al. |
| 2010/0310764 A1 | 12/2010 | Arnold et al. |
| 2012/0156362 A1 | 6/2012 | Sadovoy et al. |

FOREIGN PATENT DOCUMENTS

| | | |
|---|---|---|
| DE | 10 2015 015 090 A1 | 5/2017 |
| EP | 2 618 941 B1 | 7/2013 |
| EP | 2 641 661 A1 | 9/2013 |
| WO | WO 93/18860 A1 | 9/1993 |
| WO | WO 2015/041760 A1 | 3/2015 |

OTHER PUBLICATIONS

PCT/EP2018/071457, International Search Report dated Nov. 6, 2018 (Three (3) pages).
German Search Report Issued in German counterpart application No. 10 2017 215 725.9 dated Mar. 27, 2018, with Statement of Relevancy (Ten (10) pages).
English-language Chinese Office Action issued in Chinese application No. 201880042478.7 dated Jun. 21, 2021 (Six (6) pages).

\* cited by examiner

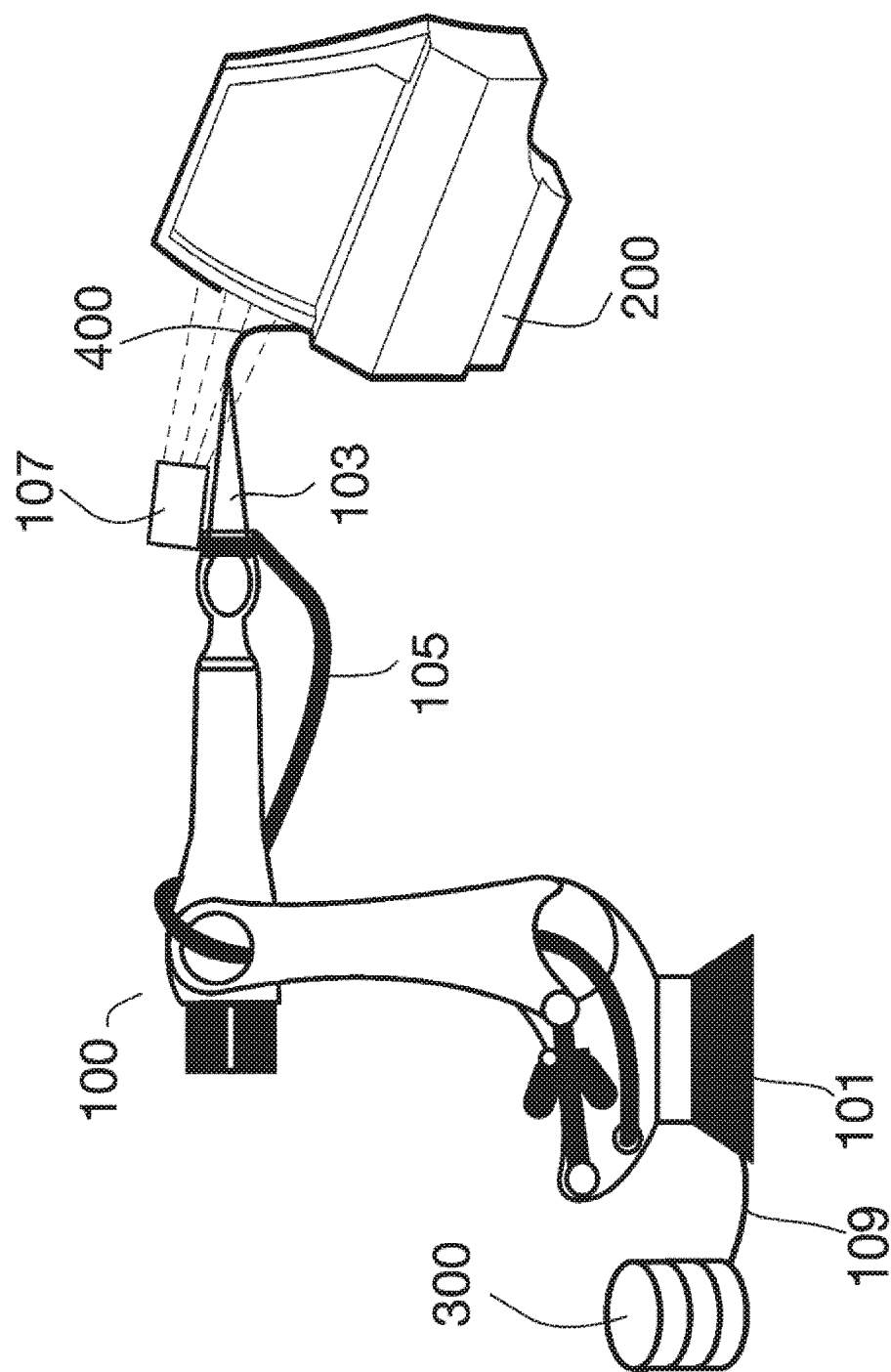

APPARATUS AND METHOD FOR APPLYING A SEALING AND/OR COATING SUBSTANCE

CROSS REFERENCE TO RELATED APPLICATIONS

This application is a continuation of PCT International Application No. PCT/EP2018/071457, filed Aug. 8, 2018, which claims priority under 35 U.S.C. § 119 from German Patent Application No. 10 2017 215 725.9, filed Sep. 7, 2017, the entire disclosures of which are herein expressly incorporated by reference.

BACKGROUND AND SUMMARY OF THE INVENTION

The invention relates to an apparatus and a method for applying a sealing and/or coating substance to a component, in particular a vehicle body component.

An application of a sealing or coating substance comprises applying an adhering layer of formless substance to the surface of a component. With this coating, sealing or coating substance can furthermore also be applied between different components. A coating may be a thin layer or a thick layer and also may be a number of layers lying one on top of the other or one next to the other.

In the case of machine coating, the operation is performed by a machine. A wide variety of methods are used for this. In the case of spray painting, a sealing and/or coating substance is usually applied by compressed air as it leaves a nozzle by a spray device, in particular is atomized. In the case of electric paint spraying, a spray mist is electrostatically charged and sprayed onto a grounded workpiece. A sealing and/or coating substance is in this case often evenly distributed on a component. In the case of very-high-pressure spraying, a sealing and/or coating substance is atomized to a greater extent by very high pressure than in the case of spray painting. It is used in particular for large areas, and also for the application of greater layer thicknesses and coating substances of a high solids content. Application of a sealing or coating substance may be performed by means of robots.

The patent application US2006233945 A1 discloses a method for painting an object by using at least one robot unit, which is operated by a control unit. For this purpose, at the beginning information with respect to the features of the object is acquired. According to the information acquired, then a sequence of commands that can be executed directly by a control unit is generated in real time. After that, the sequence of commands is transferred to the control unit and is executed by the robot unit.

The patent application US2010047465 A1 relates to a paint shop for components of motor vehicles, aircraft and wind power installations. The paint shop comprises a transport path for transporting components to be painted by the paint shop, a painting robot for painting the components and a path for positioning the painting robot along the travel route. In this case, the travel route of the painting robot is arranged at right angles to the transport path for the components to be painted.

The patent application US2012156362 A1 discloses a method for generating a path of movement for a spray gun for coating a component. In this case, first of all path templates for surface segments of the component are defined and used as a basis for generating a first path of movement. By simulation of a model of the spray profile, the coating thickness is estimated and compared with given tolerances. If the given tolerances are not achieved, an adapted path of movement is generated. This sequence is repeated until the simulation shows that the given tolerances are maintained.

Normally, components are produced with tolerances, in particular so that later, during assembly, for example to form a vehicle body, they are within a given maximum overall tolerance. However, this has the consequence that the actual dimensions of components of one component type sometimes deviate greatly from one another within the component tolerance when they are provided for the application of a sealing or coating substance. Furthermore, to conform to given functionality and cycle-time specifications of the apparatus for applying a sealing or coating substance, it is often necessary to start out from an unfavorable combination of tolerances. This has adverse effects on the production result, i.e., the coated component.

An object of the present invention is to improve the application of a sealing and/or coating substance.

According to a first aspect of the invention, an apparatus for applying a sealing and/or coating substance to a component, in particular a vehicle body component, is provided. The apparatus comprises kinematics, a spray device and a sensor. Furthermore, the apparatus is configured for performing the following steps: a) acquiring computer-aided design (CAD)-based information on the component; and in real time (preferably with respect to steps b, c and d): b) acquiring actual information on the component by the sensor; c) creating a movement profile for the kinematics and an application profile for the spray device on the basis of the CAD-based information and the actual information; d) executing the movement profile and the application profile on the component.

As a result, an application of a sealing and/or coating substance can advantageoulsy be adapted to actual dimensions of a component, irrespective of how many processing steps the component has already passed through and by how much as a result its dimensions deviate from modeled ideal dimensions.

In the context of the invention, sealing and/or coating substances may be all substances that can be applied to a vehicle body, in particular for protection from corrosion (for example paints, coatings), from noise (for example foams) or from stone impact (for example PVC substances). Adhesives, sealants (for example silicones) and upholstery fabrics are also covered by the term.

The apparatus may comprise its own controller or control functionalities, in order to activate the kinematics, the spray device and/or the sensor and perform the steps for which it is configured. In addition or as an alternative, a controller of the kinematics, the spray device and/or the sensor may provide these functionalities.

In the context of the invention, kinematics may be a machine tool for moving the spray device in relation to the component, for example a robot. In addition or as an alternative, kinematics, for example a robot, may move the component in relation to the spray device.

In the context of the invention, a spray device may be a commercially or industrially commonplace spray nozzle. In particular, it may be an airless spray system. Furthermore, a spray device may comprise an electric spray nozzle.

The sensor may in principle be mounted wherever observation of the application of the sealing and/or coating substance is adequately possible. In particular, the sensor may be arranged on the kinematics and/or on the spray device. According to a preferred embodiment, the sensor is arranged within the spray device. In this way, particularly good observation of the application of the sealing and/or coating substance can advantageously be made possible, and/or a measurement of the component can be performed before the application.

In the context of the invention, real time should be understood as meaning an implementation of steps such that certain time constraints are satisfied, at least on average. For example, the result of a step must be ascertained within a certain time period. In addition or as an alternative, real time may be understood as meaning that a result of a respective step is ascertained without any noticeable delay.

CAD-based information comprises information of a CAD model of the component. CAD-based information may also comprise other information about the component, which relates in particular to at least one geometrical dimension. As described more specifically below, CAD-based information may also be information which comprises information on an actual component, in particular in order to improve the ideal model information with respect to its accuracy by actual component information.

According to one embodiment of the aforementioned aspect, the CAD-based information is categorized on the basis of actual information on the component. A CAD model of the component may for example form a starting position. This CAD model may be assigned to one category from a set of predefined categories by further component-related information. The categories may in particular reflect a deviation of the component from the CAD model. Components that represent a minor deviation from the CAD model with regard to one or more dimensions are assigned a particular category and components that represent a major deviation from the CAD model with regard to these dimensions are assigned another category. Depending on the requirements, CAD-based information may be differentiated in any number of categories.

As a result, a simple adaptation of an ideal CAD model to actual deviations of a component can be advantageously achieved.

According to one embodiment, the apparatus is configured to communicate the CAD-based information and/or the actual information via a cloud. A cloud may in this case concern both an internal network (intranet), which comprises a corresponding storage unit, and/or an external network, such as for example the Internet.

As a result, CAD-based information and/or actual information can be advantageously supplied easily to the apparatus and provided for other processing steps.

In one embodiment, the actual information is geometrical information on the component and/or information about an already applied sealing and/or coating substance. The latter information may be in particular a material thickness.

Such information may be advantageous as a direct benchmark for comparison with the CAD-based information. In addition and as an alternative, such information may serve as an input value for the kinematics and/or the spray device, in particular in order to move at least one of these machines on the basis of this information.

In one embodiment, the actual information is acquired by a digital position acquisition system. Such a position acquisition system may be in particular a laser scanner and/or an image-based acquisition system and/or a radar. An analog position acquisition system with a corresponding digitizing device may also be additionally or alternatively used.

According to one embodiment, the actual information is acquired by a further sensor. This may be on the one hand redundant acquisition of the same actual information; for example, a material thickness of an already applied sealing and/or coating substance may be acquired by two sensors at the same time. In addition or as an alternative, it may be the acquisition of other actual information, for example in addition to the material thickness a diameter of a given location of the component to be processed. The further sensor may be a sensor that operates on the same measuring principle or acquires actual information by a different measuring principle. For example, a laser scanner and a radar sensor may be used in parallel in order to acquire actual information.

As a result, the accuracy of the measurement can be advantageously increased by integrating the various measurements. Furthermore, a measurement can also be performed when one of the sensors is not operational, for example because it has failed or the measured variable cannot be observed in a particular position. Consequently, a measurement obtained by using a number of sensors can become more robust.

According to one embodiment, a sensor acquires actual information, dependent on a production step. In the context of the application, a production step may be on the one hand a step in which the component is differently processed, for example after coating with a sealant, a coating with a coating substance may be performed. In addition or as an alternative, a production step may be defined by a given phase. For example, after a phase of five seconds from the beginning of the application of a sealing and/or coating substance, a first production step may be ended and a second production step begun. Thus, for example, a first sensor may acquire actual information during a first phase of an application of a sealing and/or coating substance. For example, a diameter of an already painted body part is first acquired by a laser scanner. In a second phase of the application, an image sensor then acquires an already applied layer thickness of the sealing and/or coating substance, because the image sensor is better able to distinguish the applied substance from the component.

As a result, depending on a production step, a sensor that is optimally suited for the respective production step and/or is best able to capture the component may be advantageously selected.

According to one embodiment, the movement profile of the kinematics comprises at least one position-based parameter. In the context of the invention, position-based information comprises information that is based on a position or orientation, and in particular can be transformed appropriately in itself by derivation or integration, such as speed, acceleration and/or jolting. Each item of information concerned here may either be acquired directly by a sensor and/or be based on other position-based information by derivation or integration.

As a result, the movement profile can be advantageously adapted to different kinematic conditions. For example, in one embodiment a jolt may be calculated on the basis of acquired actual information that represents an acceleration and the kinematics may be activated in such a way that this jolting is minimal, in order when applying the coating to achieve an application of the sealing and/or coating substance that is as even as possible.

In one or more embodiments, the application profile of the spray nozzle may be dependent on one and/or more of the following parameters. The application profile of the spray nozzle may be dependent on the nozzle diameter. Depending on the acquired actual information and installed nozzle diameter, the movement profile of the kinematics and/or the application profile of the spray nozzle may consequently be passed through for example more quickly or more slowly, in order to achieve a high-quality application of the sealing and/or coating substance. In addition or as an alternative, the application profile may be based on a distance of the spray nozzle from the component. For example, this distance may be 60 mm.

One parameter may be a flow rate, which indicates how much volume of the sealing and/or coating substance is flowing or has flowed through the spray device per unit of time. Furthermore, one parameter may be a pressure with which the sealing and/or coating substance is applied to the component. A temperature of a sealing and/or coating substance to be applied is likewise a parameter on which the application profile may be dependent. And as already described in relation to the previous embodiments, the application profile of the spray device may comprise a speed of the kinematics and/or of the spray device itself. In addition or as an alternative, the application profile of the spray device may be based on an orientation of the spray device. The application profile of the spray device may comprise the movement profile of the kinematics.

As a result, the application profile can be advantageously adapted flexibly to a wide variety of parameters of the kinematics and/or of the spray nozzle.

According to a further embodiment, a movement profile and/or application profile may be created and executed on the basis of the acquired information, wherein the creation is based on a model of the application properties, i.e., in particular the spraying and/or coating properties of the sealing and/or coating substance. This model may for example comprise, at least in an approximated form, the mass of a sealing and/or coating substance to be applied. For example, a gravitation-induced deviation of the position of the sealing and/or coating substance to be applied in relation to the desired application position may be compensated by suitable choice of the movement profile of the kinematics and/or the application profile of the spray device.

Such an inclusion of one or more properties of a sealing and/or coating substance advantageously allows an application of this sealing and/or coating substance to be improved.

According to one embodiment, the apparatus is set up to run through steps a), b), c) and d) at least partially one after the other. As a result, it is for example established that the CAD-based information is known to the apparatus before sensor-based actual information is acquired. And only after acquisition of both these sets of information are the movement profiles for the kinematics and the spray device created and executed.

As a result, an integration of the sensor-supported actual information with the CAD-based information and, on the basis of the integrated information, an execution of the movement profiles may advantageously be performed. In the context of the invention, an integration in this case comprises any strategy for unifying the two sets of information, for example a maximum-likelihood integration, which minimizes the estimation error, comes into consideration for increasing the reliability of information.

According to one embodiment of the invention, steps a)-d) are at least partially run through more than once. For example, first (according to the previous embodiment) CAD-based information is acquired once, for example a CAD model of the component is read in (step a). After that, actual information, for example a thickness of an already applied sealing and/or coating substance, is ascertained in a sensor-supported manner (step b), after that the movement profile for the kinematics and the application profile for the spray device are created (step c) and after that the two profiles are executed (step d). During the execution, further actual information is acquired and the movement profile or the application profile are correspondingly adapted. Steps b) and c) are therefore run through once again, to be precise in parallel with step d).

As a result, the actual information can advantageously be acquired, for example in real time, during the application of the sealing and/or coating substance and on this basis the movement profile and/or the application profile can be adapted and the updated profiles can then be executed.

According to a further aspect of the invention, a method for operating an apparatus according to the previous aspect or according to one of the embodiments thereof is provided, comprising the steps: a) acquiring CAD-based information on the component; and in real time (preferably with respect to steps b, c and d): b) acquiring actual information on the component by a sensor; c) creating a movement profile for the kinematics and an application profile for the spray device on the basis of the CAD-based information and the actual information; d) executing the movement profile and the application profile on the component.

Further features, advantages and application possibilities of the invention emerge from the following description in connection with the FIGURE.

Other objects, advantages and novel features of the present invention will become apparent from the following detailed description of one or more preferred embodiments when considered in conjunction with the accompanying drawing.

BRIEF DESCRIPTION OF THE DRAWING

The FIGURE shows an embodiment, given by way of example, of an apparatus for applying a sealing and/or coating substance.

DETAILED DESCRIPTION OF THE DRAWING

According to the FIGURE, a robot system is used as an apparatus 100 according to one embodiment of the invention for applying a sealing and/or coating substance 400 to a painted vehicle door 200.

Due to the painting, the dimensions of the vehicle door deviate from the ideal dimensions from the CAD model, which alone describe the raw state of the vehicle door. For this reason, the vehicle door was already measured in a preceding working step and categorized to a predefined group of vehicle doors that resemble one another with regard to the dimensional deviations caused by the painting and other processes.

For this purpose, in the exemplary embodiment a hundred vehicles were measured and deviations from the ideal CAD model calculated. These deviations were categorized in ten individual ranges. The category with the smallest deviations is referred to as a "range 1 component". In order to process such a component, the robot controller is operated with the corrective information required for a range 1 component. Then there is a "range 2 component", which is processed with the corrective information for a range 2 component, and so on.

For the categorization, vehicle doors are measured when they come from bodymaking. In addition or as an alternative, the vehicles are measured when they come from painting. As a result, it can be established with which bodymaking production quality which deviation occurs on the painted body. Then, the current vehicles are classified according to the deviation established. This information is then fed to the robot controller.

Used as the kinematics is a commercially commonplace industrial robot 101 with six degrees of freedom, which is operated by an integrated controller.

As a spray device, a spray nozzle 103 for a liquid plastic, for example PVC, is mounted on the end effector of the robot. The plastic is passed to the nozzle via a hose 105.

The apparatus according to the invention is additionally implemented in the robot controller. This is set up for acquiring CAD-based information on the component. These data concern CAD model data and the categorization on the basis of the CAD model data and assigned to the preceding measurement, as described above. The data are fed to the apparatus via a database 300. This database is connected to the apparatus via a network. In addition or as an alternative, the database may be stored decentrally on a cloud. Then, the embodiment is configured such that it can communicate with such a cloud storage. The connection 109 between the database and the apparatus may, according to requirements, be of a wire-bound or wireless configuration.

Arranged on the robot as a sensor is a laser scanner (107), which acquires actual information on the vehicle door in real time before and/or during the application. The laser beams are indicated by dashed lines. The sensor captures the state of the vehicle door to be coated several times per second, for example at a sampling rate of 1 kHz. As a result, it is possible to acquire the dimensions of the vehicle door exactly and to base the application of the sealing and/or coating substance on exact, current component dimensions, and consequently to achieve a higher quality of the applied substance and avoid subsequent corrections or remedial alterations. The sensor-supported recording of the actual information allows a component measured in the raw state to be measured more accurately. This is also advantageous because a vehicle door body in the raw state can still change with regard to its dimensions, in particular as a result of being cleaned of adhesives or as a result of thermal processes.

The actual information of the sensor 107 is fed to the robot controller in real time and fused there with the CAD-based information—likewise in real time—so that the robot and the spray nozzle can be activated in a way corresponding to the latest information about the state of the vehicle door. A movement profile for the kinematics 101 and/or an application profile for the spray device 103 is in this case realized for example by a simple position-based feedrate control.

Consequently, with the CAD-based information, in particular on the basis of the assigned category, the component is therefore broadly described with regard to its dimensions and a fine control on the basis of more accurate and more up-to-date component dimensions is made possible by the subsequent acquisition of the actual information by the sensor 107, and the substance is finally applied such that it is adapted directly to the vehicle door present in the cell.

The assignment of the CAD-based information to the components may take place in particular by way of an internal control number, under which component-related information is stored. CAD information forms a kind of zero reference for each component. Information about the category described above then forms a first differentiation with regard to the dimensions of the component. When the component, in particular the body, arrives at the cell in which the application of the sealing and/or coating substance is to be performed, this information is fed to the robot controller, and consequently the movement profile and the application profile are executed on the component 200.

The acquisition of the actual information takes place in this case prior to the application of the sealing and/or coating substance. It follows from this that the apparatus, which initially only has the CAD-based information available to it, performs on the basis of the actual information a correction of the component dimensions of the component currently to be processed, and on this basis applies the sealing and/or coating substance. For example, the acquired actual information may lead to the robot correcting a route planned on the basis of the CAD-based information by values in the range of several hundredths or several tenths or several millimeters (for example 0.07 mm or 0.5 mm or 3 mm) to the right.

The component dimensions updated by the actual information may preferably be stored as component information, in particular under the control number, in order in particular to be available for subsequent working steps.

The two-stage model implementation on the basis of CAD-based information and on the basis of sensor-supported actual information makes a reduction of the system power possible, and also improved deviation management.

LIST OF REFERENCE CHARACTERS

100 Apparatus
101 Kinematics/robot system
103 Spray device
105 Feed for sealing and/or coating substance
107 Sensor/laser scanner
109 Network connection
200 Component/vehicle door
300 Database/cloud
400 Sealing and/or coating substance The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. An apparatus for applying a sealing and/or a coating substance to a component, comprising:
   kinematics;
   a spray device; and
   a first sensor;
   wherein the apparatus is configured to:
   a) acquire computer-aided design (CAD)-based information on the component;
   and in real time:
   b) acquire actual information on the component by the first sensor;
   c) create a movement profile for the kinematics and an application profile for the spray device on a basis of the CAD-based information and the actual information; and
   d) execute the movement profile and the application profile on the component;
   wherein the CAD-based information is categorized in one of a plurality of categories based on measurement information of the component, wherein the plurality of categories each reflects a respective dimensional deviation range from an ideal CAD model of the component, and wherein the dimensions of the component deviate from the ideal dimensions of the ideal CAD model caused by applying a sealing and/or a coating substance to a component.

2. The apparatus according to claim 1, wherein the apparatus is further configured to communicate the CAD-based information and/or the actual information via a cloud.

3. The apparatus according to claim 1, wherein the actual information is geometrical information on the component and/or information about a previously applied sealing and/or coating substance.

4. The apparatus according to claim 1, wherein the first sensor is a digital position acquisition system.

5. The apparatus according to claim 1, wherein the apparatus is configured to additionally acquire the actual information by a second sensor.

6. The apparatus according to claim 1, wherein the apparatus is configured to acquire the actual information by the first sensor dependent on a production step.

7. The apparatus according to claim 1, wherein the movement profile is dependent on at least one of the following parameters:
- position;
- orientation;
- speed; and
- acceleration.

8. The apparatus according to claim 1, wherein the application profile is dependent on at least one of the following parameters:
- nozzle diameter;
- distance from the component;
- flow rate;
- pressure;
- volume;
- temperature;
- speed of the kinematics and/or the spray device; and
- orientation of the spray device.

9. The apparatus according to claim 1, wherein the movement profile and/or the application profile are created such that a distance between the spray device and the component is no more than 60 mm.

10. The apparatus according to claim 1, wherein the apparatus is configured to run through processes a), b), c) and d) at least partially one after the other and/or more than once.

* * * * *